(12) United States Patent
Mourrier et al.

(10) Patent No.: US 10,468,966 B1
(45) Date of Patent: Nov. 5, 2019

(54) GATE INTERFACE CIRCUIT

(71) Applicant: Infineon Technologies AG, Neubiberg (DE)

(72) Inventors: Andre Mourrier, Manosque (FR); Patrick Vaquette, Rognes (FR)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/996,198

(22) Filed: Jun. 1, 2018

(51) Int. Cl.
| | |
|---|---|
| *H03K 17/687* | (2006.01) |
| *H02M 1/088* | (2006.01) |
| *H03K 5/02* | (2006.01) |
| *H03F 3/45* | (2006.01) |
| *H03K 5/08* | (2006.01) |
| *H01L 27/02* | (2006.01) |
| *H02M 7/5395* | (2006.01) |
| *H02P 27/08* | (2006.01) |
| *H03K 17/08* | (2006.01) |

(52) U.S. Cl.
CPC ........ *H02M 1/088* (2013.01); *H01L 27/0255* (2013.01); *H02M 7/5395* (2013.01); *H02P 27/08* (2013.01); *H03F 3/45071* (2013.01); *H03K 5/02* (2013.01); *H03K 5/08* (2013.01); *H03K 17/08* (2013.01); *H03F 2200/267* (2013.01); *H03F 2203/45151* (2013.01); *H03F 2203/45156* (2013.01)

(58) Field of Classification Search
USPC ................................................ 327/108–112
See application file for complete search history.

(56) References Cited

U.S. PATENT DOCUMENTS

| | | | | |
|---|---|---|---|---|
| 5,805,405 | A * | 9/1998 | Benkaroun | H01F 7/1833 361/194 |
| 5,856,809 | A * | 1/1999 | Schoepfer | H01Q 21/50 343/703 |
| 10,289,182 | B2 * | 5/2019 | Bezawada | H02H 9/008 |
| 2008/0278125 | A1 * | 11/2008 | Pigott | H02M 1/38 323/271 |
| 2012/0081058 | A1 * | 4/2012 | Bortolus | H02K 11/001 318/490 |
| 2014/0088753 | A1 * | 3/2014 | Lim | H02P 6/14 700/168 |

(Continued)

OTHER PUBLICATIONS

Microcontroller with LIN and BLDC MOSFET Driver for Automotive Applications, Data Sheet, TLE9879QXA40, Feb. 2, 2017, 126 Pages, vol. 1.

(Continued)

*Primary Examiner* — Adam D Houston
(74) *Attorney, Agent, or Firm* — Slater Matsil, LLP

(57) ABSTRACT

A circuit includes a first feedforward path configured to determine a state of a first power switch using a first gate control voltage from a gate driver and a source voltage of the first power switch, and to apply a gate driving voltage to a gate of the first power switch based on the determined state of the first power switch; and a first feedback path configured to provide a scaled value of a drain voltage of the first power switch and a scaled value of the source voltage of the first power switch to the gate driver, where the first feedforward path and the first feedback path are configured to provide a bi-directional gate interface coupled between the gate driver and the first power switch.

21 Claims, 10 Drawing Sheets

(56) References Cited

U.S. PATENT DOCUMENTS

2014/0176239 A1* 6/2014 Duggal ............... H03F 3/45183
  330/260
2016/0327970 A1* 11/2016 Belet ......................... G06F 1/26
2017/0373615 A1* 12/2017 Lewis .................... H02K 7/145

OTHER PUBLICATIONS

Microcontroller with LIN and BLDC MOSFET Driver for Automotive Applications, Data Sheet, TLE9879QXA40, Apr. 30, 2015, 122 pages, vol. 1.

* cited by examiner

GATE INTERFACE CIRCUIT

TECHNICAL FIELD

This disclosure relates in general to electronic circuits and systems, and, in particular, to a circuit and method for providing a gate interface between a gate driver and a power switch.

BACKGROUND

A power system may include a power control circuit, a plurality of power switches (e.g., metal-oxide-semiconductor field-effect transistors (MOSFETs)) coupled to and controlled by the power control circuit, and a load (e.g., a motor) coupled to and driven by the power switches.

The power control circuit may include a power management circuit, a driver circuit, control logic, diagnostic logic, or other circuits. The power management circuit may be used for generating and/or regulating power supply voltages. The control logic may include a micro-controller that monitors and controls the operation of the power system. A motor driver can have a controller that generates a pulse-width modulated signal used to produce drive signals for the power switches for different phases of the motor.

Power control circuits may be implemented on semiconductor substrates as integrated circuit (IC) chips, such as power control ICs (may also be referred to as gate drivers, or gate driver ICs). Due to the small footprint and energy efficiencies of gate driver ICs, gate driver ICs are widely used in various applications and products across different industries, e.g., such as consumer electronics, industrial control, medical equipment, aviation, and automotive.

Depending on the specific applications of the power system, various loads (e.g., different motors) of the power system may operate at different voltages and may need different driving capabilities from the gate driver IC. The gate driver IC, however, may not be able to accommodate all of the different requirements (e.g., driving voltages, driving current) of different applications. Re-designing (e.g., customizing) the gate driver IC for different applications, however, may be costly and time-consuming. There is a need in the art for power systems that can adapt to various applications while using a same gate driver IC.

SUMMARY

In accordance with an embodiment of the present invention, a circuit includes a first feedforward path configured to determine a state of a first power switch using a first gate control voltage from a gate driver and a source voltage of the first power switch, and to apply a gate driving voltage to a gate of the first power switch based on the determined state of the first power switch; and a first feedback path configured to provide a scaled value of a drain voltage of the first power switch and a scaled value of the source voltage of the first power switch to the gate driver, where the first feedforward path and the first feedback path are configured to provide a bi-directional gate interface coupled between the gate driver and the first power switch.

In accordance with an embodiment of the present invention, a power system includes a gate driver integrated circuit (IC); a plurality of power switches; and a first gate interface between the gate driver IC and a first power switch of the plurality of power switches, where the first gate interface is configured to: determine, using a first processing circuit, whether to turn the first power switch on or off by comparing a first gate control voltage provided at a first output pin of the gate driver IC and a first voltage at a first input pin of the gate driver IC that is proportional to a voltage at a source of the first power switch; shift, using a first level shifter, an output voltage of the first processing circuit to an output voltage of the first level shifter different from the output voltage of the first processing circuit; supply, using a first driver circuit, a driving voltage at a gate of the first power switch; and send, using first voltage adaptation circuits, a value of a source voltage and a value of a drain voltage of the first power switch to the gate driver IC.

In accordance with an embodiment of the present invention, a method of operating a power system, which includes a first gate interface configured to be coupled between a gate driver integrated circuit (IC) and a first power switch, includes: receiving, by the first gate interface, a first gate control voltage from the gate driver IC; determining, by the first gate interface, whether to turn on or off the first power switch by comparing the first gate control voltage with a voltage proportional to a source voltage of the first power switch; generating, by the first gate interface, a gate driving voltage at an output of the first gate interface based on the determination of whether to turn on or off the first power switch; applying, by the first gate interface, the gate driving voltage to a gate of the first power switch; scaling, by the first gate interface, a voltage at a source of the first power switch to generate a scaled source voltage; and sending, by the first gate interface, a value of the scaled source voltage to the gate driver IC.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the disclosed embodiments and are not necessarily drawn to scale.

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely power systems and methods of operating the power systems.

In embodiments of the present invention, a circuit is disclosed that provides a bi-directional gate interface that is coupled between a gate driver IC and a power switch of a power system. The bi-directional gate interface allows control of the power switch by the gate driver IC along a feedforward direction (e.g., from the gate driver IC to the power switch). The bi-directional gate interface also allows the status (e.g., drain voltage, source voltages) of the power switch to be sent back to the gate driver IC along a feedback direction (e.g., from the power switch to the gate driver IC). In some embodiments, the bi-directional gate interface determines the state (e.g., ON or OFF) of the power switch by comparing a gate control voltage from the gate driver IC with a measured value of the source voltage (e.g., a scaled value of the source voltage) of the power switch, shifts the gate control voltage from a first voltage to a second voltage (e.g., a higher voltage), and applies a driving voltage to the gate of the power switch. In some embodiments, since status information regarding, e.g., the source-drain voltage of the power switch is sent back to the gate driver IC via the bi-directional gate interface, the gate driver IC can monitor and control the operation of the power system.

Figure 1:
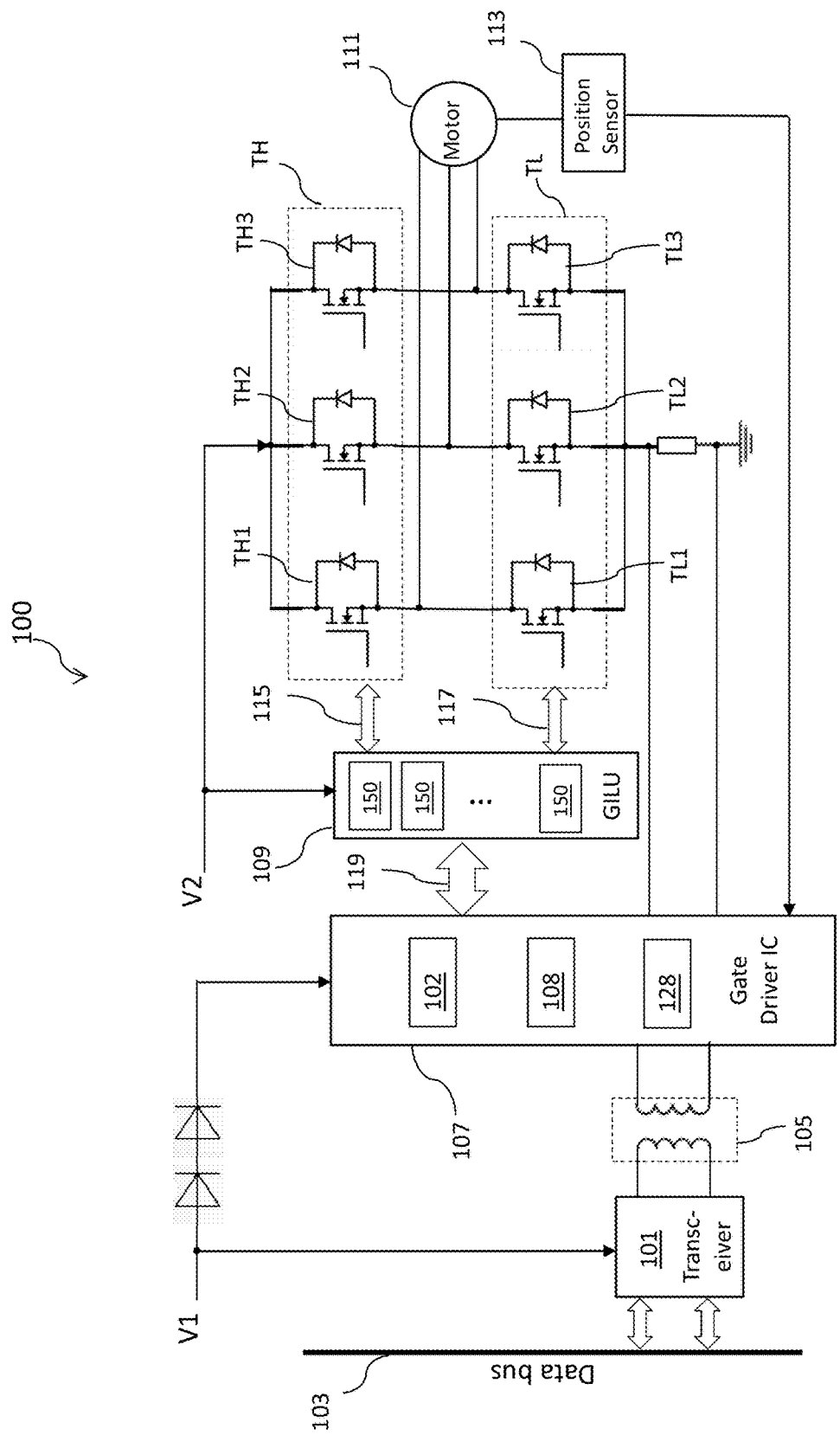
FIG. 1 illustrates a block diagram of a power system, in an embodiment.

FIG. 1 illustrates a block diagram of a power system 100, in an embodiment. In particular, FIG. 1 illustrates an exemplary application where the power system 100 is used for controlling a three-phase motor 111. The power system 100 may be used, for example, to operate an electronic power steering system or a power brake system in an automobile. The three-phase motor application is merely a non-limiting example, as embodiment systems and method disclosed herein may be applied to other applications besides motor applications. In addition, one of ordinary skill in the art would appreciate that other connections and other functional blocks may exist within the power system 100 of FIG. 1. For clarity, not all features of the power system 100 are illustrated in FIG. 1.

As illustrated in FIG. 1, the power system 100 includes a gate driver IC 107, a gate interface logic unit (GILU) 109, power switches (e.g., high side switches TH1, TH2, and TH3, and low side switches TL1, TL2, and TL3), and the three-phase motor 111. The gate driver IC 107 may be powered by a first power supply having voltage V1 (e.g., 12V), the GILU 109 and the power switches may be powered by a second power supply having voltage V2 (e.g., 48V). For ease of discussion, the notation of TH may be used to refer to the high side power switches TH1, TH2, and TH3 collectively, and the notation of TL may be used to refer to the low side power switches TL1, TL2, and TL3 collectively. In addition, a notation of THx may be used to refer to one of the high side power switches (e.g., TH1, TH2, or TH3), and a notation of TLx may be used to refer to one of the low side power switches (e.g., TL1, TL2, or TL3).

FIG. 1 further illustrates additional features, such as a position sensor 113 (for sensing the rotor positions of the three-phase motor iii), a transceiver 101, and a data bus 103 (e.g., a local interconnect network (LIN) bus). The gate driver IC 107 may communicate with the transceiver 101 via, e.g., a galvanic isolation device 105 (e.g., a transformer, or a capacitive galvanic device), and the transceiver 101 may communicate with another device via the data bus 103. Details of the gate driver IC 107 and the GILU 109 are discussed hereinafter with reference to FIGS. 2-6.

Figure 2:
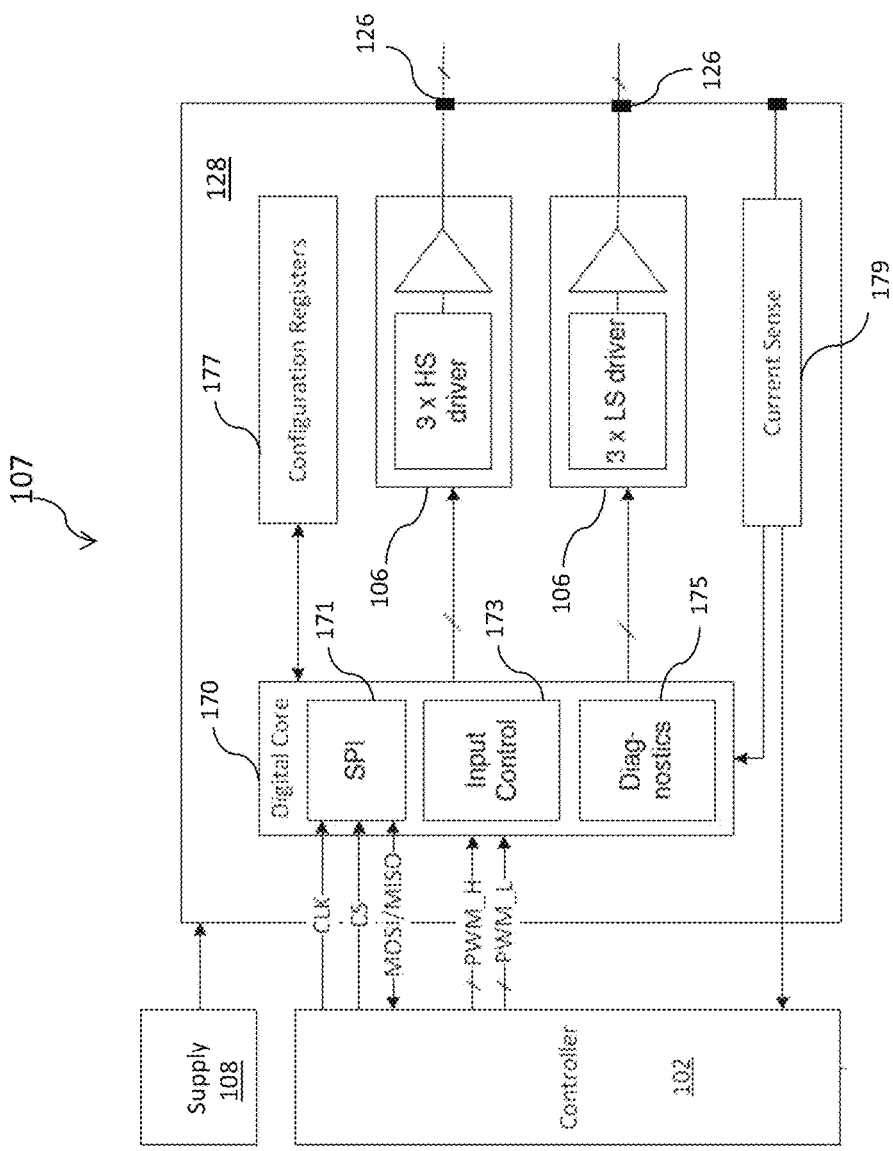
FIG. 2 is a block diagram of a gate driver IC, in an embodiment.

The gate driver IC 107 may include a plurality of modules, such as a supply module 108, a controller 102, and a pre-driver circuit 128. FIG. 2 illustrates a block diagram of an embodiment gate driver IC 107 that may be used in the power system 100 of FIG. 1. The example illustrated in FIG. 2 is illustrative and not limiting; other gate driver ICs with other structures may also be used in the power system 100.

Referring to FIG. 2, the supply module 108 of the gate driver IC 107 may be a power management circuit used for generating and/or regulating power supply voltages for the pre-driver circuit 128. The controller 102 may be a microprocessor, a central processing unit (CPU), an application specific integrated circuit (ASIC), or the like. In some embodiments, the controller 102 provides motor control via PWM signals PWM_H and PWM_L based on feedback from the current sense block of the pre-driver circuit 128. The controller 102 can also operate as the bus master for the communication interface (e.g., a serial peripheral interface (SPI)). During operation, the controller 102 receives input that determines a desired speed and direction to operate the three-phase motor 111. The input on which the PWM signals are based can be, for example, an input telling the controller 102 to speed up the motor, slow down the motor, stop the motor, reverse direction of the motor, set the speed of the motor to a particular speed and direction, and so forth. For example, in the power system 100 of FIG. 1, the input can be determined from the position sensor 113 on a steering wheel shaft of an automobile. In some embodiments, the PWM signals are created by the controller 102 based on the input and based on the current condition and state of the three-phase motor 111, with the PWM signals created to change the state of the three-phase motor 111 from a first state to a second state, where the second state is a state that is closer to a targeted state of the three-phase motor 111.

The pre-driver circuit 128 has several logical blocks inside, such as a digital core block 170 containing a communication interface 171 (e.g., an SPI bus interface), an input control logic 173, and a diagnostic logic 175. A feedback block 179, such as a current sense block, provides feedback information from the three-phase motor 111 through the pre-driver circuit 128 and back to the controller 102. Configuration registers 177 allow configuration of configurable settings in the pre-driver circuit 128. The digital core block 170 produces two pulse width modulated (PWM) signals (for the high side and low side MOSFETs) for each of the three phases, totaling six PWM switching signals provided by way of three half-bridge drivers, with each half-bridge driver having two driver circuits 106, such as a high side (HS) driver and a low side (LS) driver. The output (e.g., a gate control voltage) of each of the driver circuits 106 is sent to a respective output port 126 for controlling a corresponding power switch (e.g., one of high side power switches TH or one of low side power switches TL in FIG. 1) via the GILU 109.

Referring back to FIG. 1, the gate driver IC 107 communicates with the GILU 109 via a data path 119. The data path 119 may include a plurality of conductive paths (e.g., copper lines) between respective pins (e.g., input pins or output pins) of the gate driver IC 107 and the GILU 109. The data path 119 may carry control signals (e.g., gate control voltages) from the gate driver IC 107 to the GILU 109, and may also carry status information (e.g., drain voltages and source voltages of the power switches TH/TL) from the GILU 109 to the gate driver IC 107.

The GILU 109 communicates with the high side power switches TH via a data path 115, and with the lower side power switches TL via a data path 117. Each of the data paths 115 and 117 may include a plurality of conductive paths (e.g., copper lines) between the GILU 109 and the power switches TH/TL, which conductive paths may carry control signals (e.g., gate driving voltages) from the GILU 109 to the power switches TH/TL, and may also carry status information (e.g., drain voltages and source voltages of the power switches TH/TL) from the power switches TH/TL to the GILU 109.

In the example of FIG. 1, the GILU 109 includes a plurality of gate interfaces 150 (may also be referred to as bi-directional gate interfaces). In the illustrated embodiment, each of the three phases of the three-phase motor 111 is driven by a corresponding high side power switch THx and a corresponding low side power switch TLx, and therefore, the GILU 109 has a total of six gate interfaces 150, where each of the gate interfaces 150 is coupled between the gate driver IC 107 and a respective power switch THx or TLx. The power switches TH/TL may be any suitable switches, such as field effect transistors (FETs) (e.g., MOSFETs), insulated-gate bipolar transistor (IGBTs), or the like. The discussion herein may refer to the power switches TH/TL as MOSFETs, with the understanding that any suitable power switches may be used.

Figure 7:
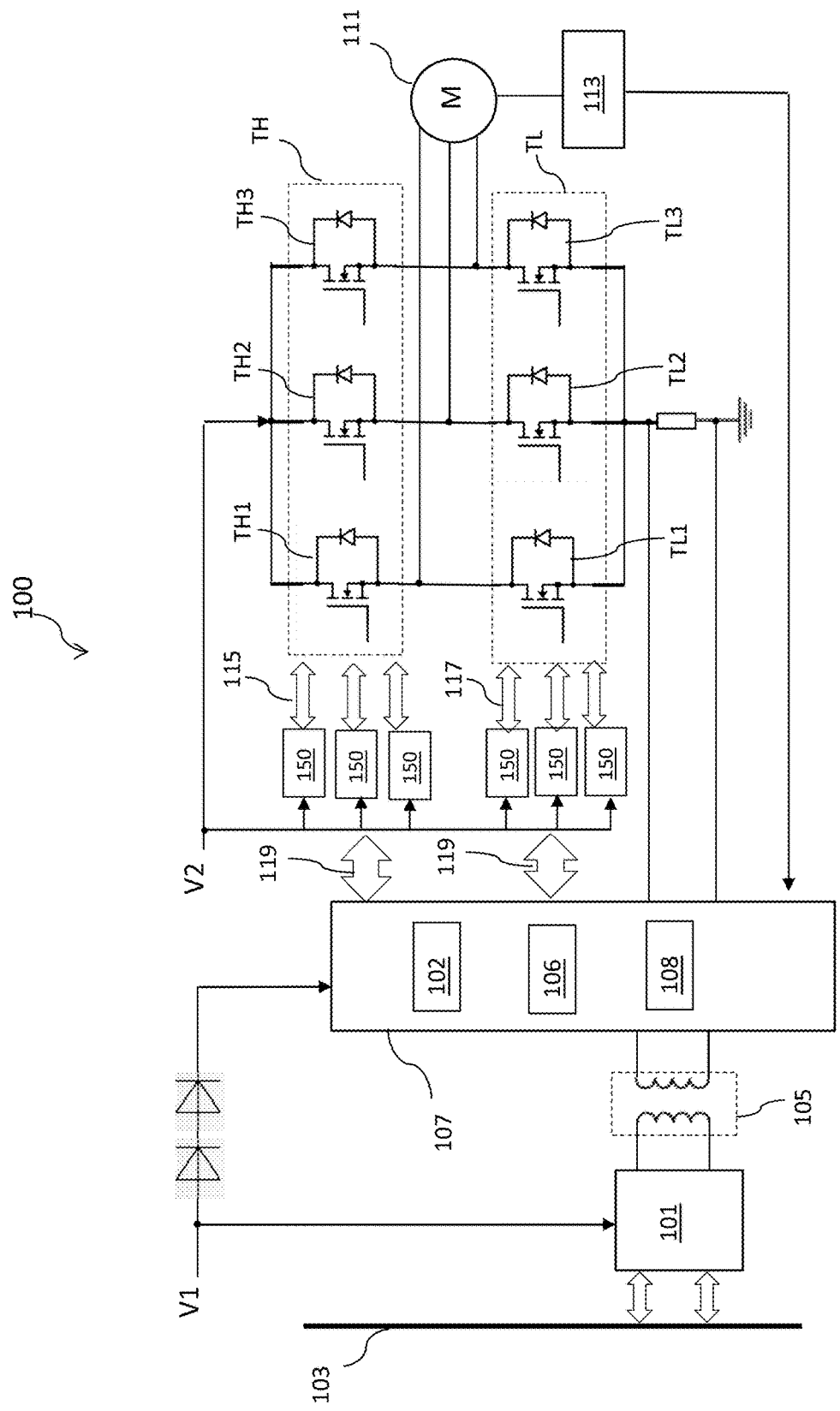
FIGS. 7-9 illustrate block diagrams of various embodiment power systems.
Figure 8:
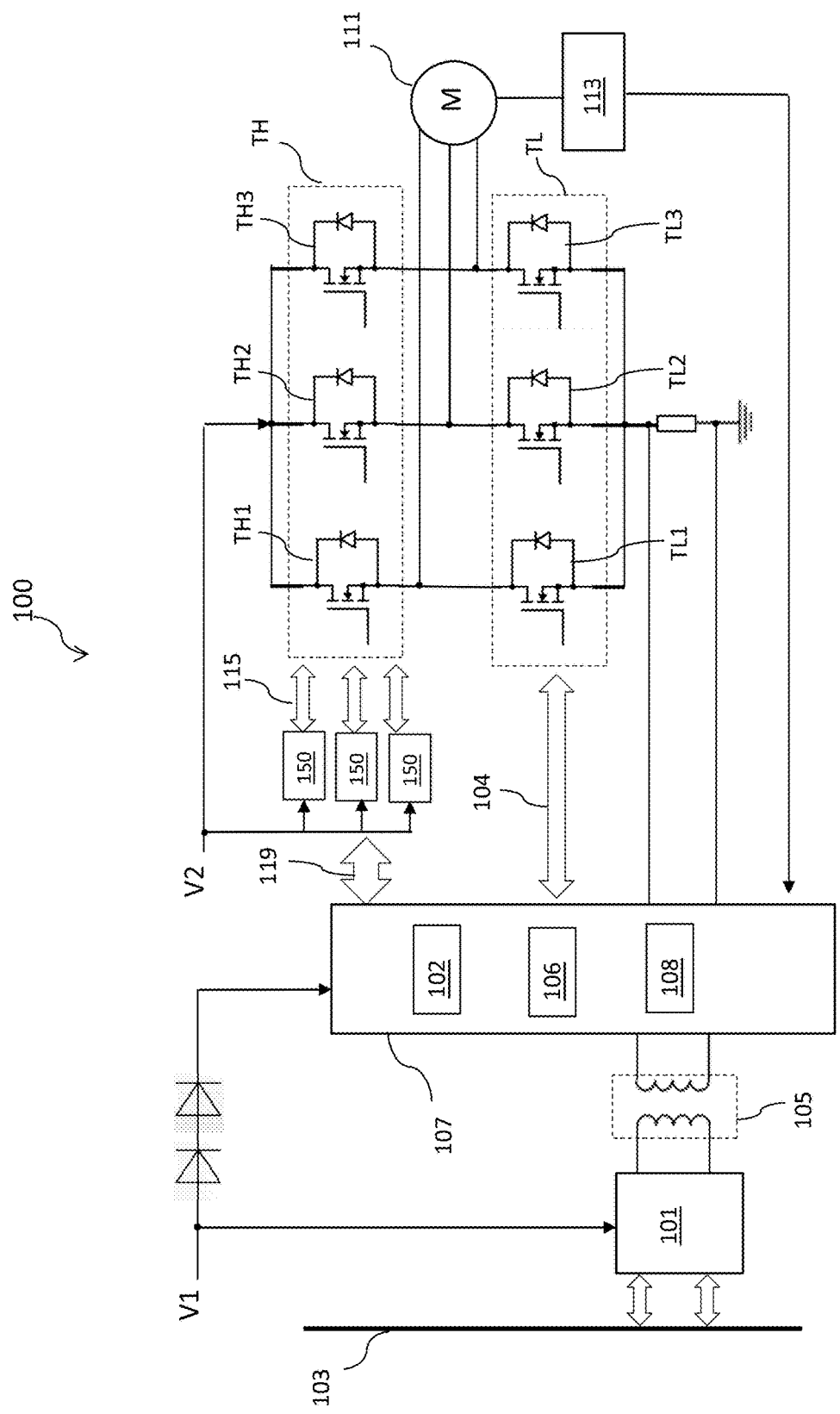
Figure 9:
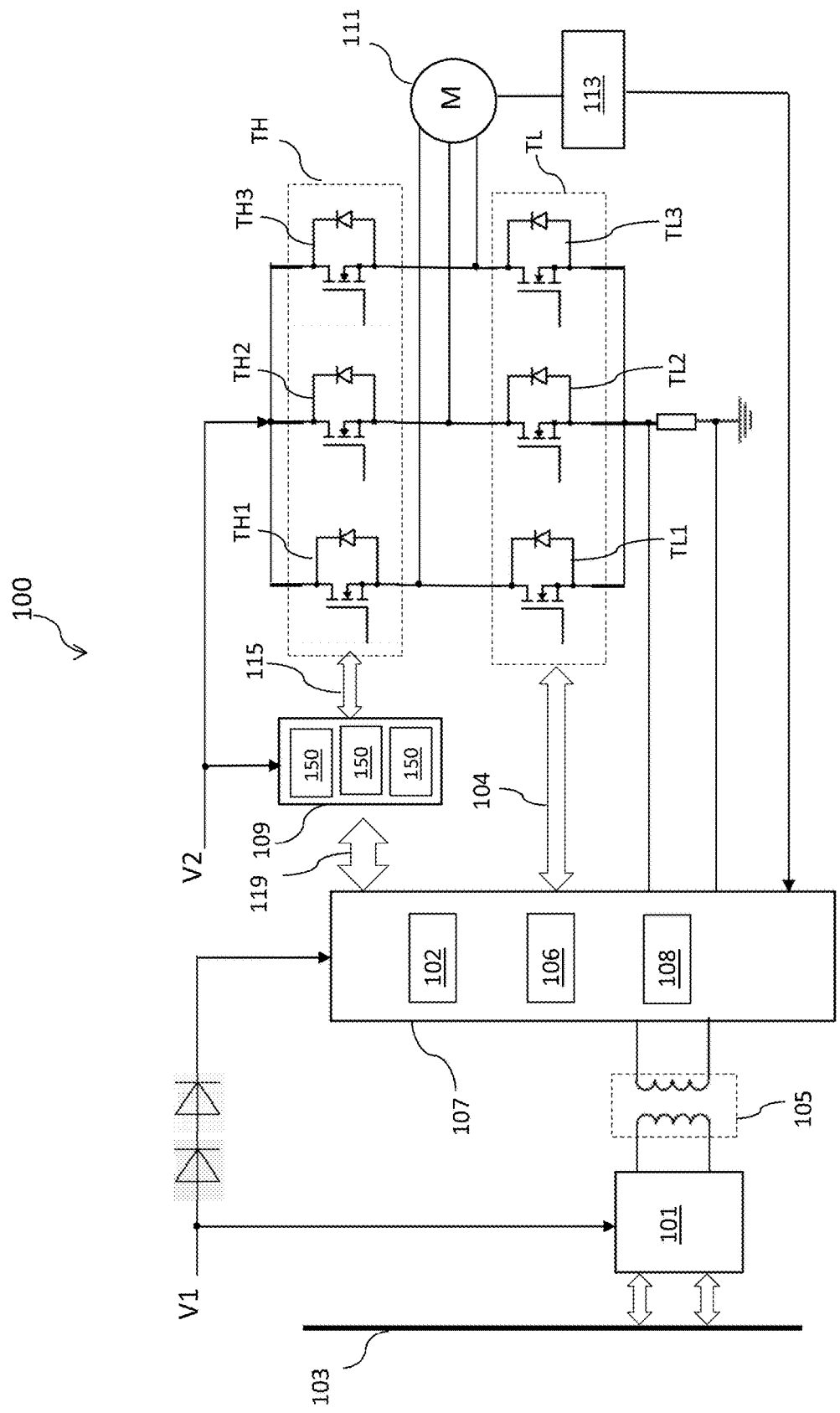

In some embodiments, the GILU 109 comprising gate interfaces 150 is implemented as an integrated circuit (IC) formed on a monolithic semiconductor substrate, such as a silicon substrate, germanium substrate, a compound semiconductor substrate, an alloy semiconductor substrate, or combinations thereof. In other words, all of the gate interfaces 150 of the GILU 109 are integrated into a single IC formed on a monolithic semiconductor substrate. This is, of course, an example. Other ways of partitioning and integration are possible and are fully intended to be included within the scope of the present disclosure. For example, FIGS. 7-9 illustrate other embodiments with different levels of integration for the gate interfaces 150, details of which are discussed hereinafter.

Figure 3:
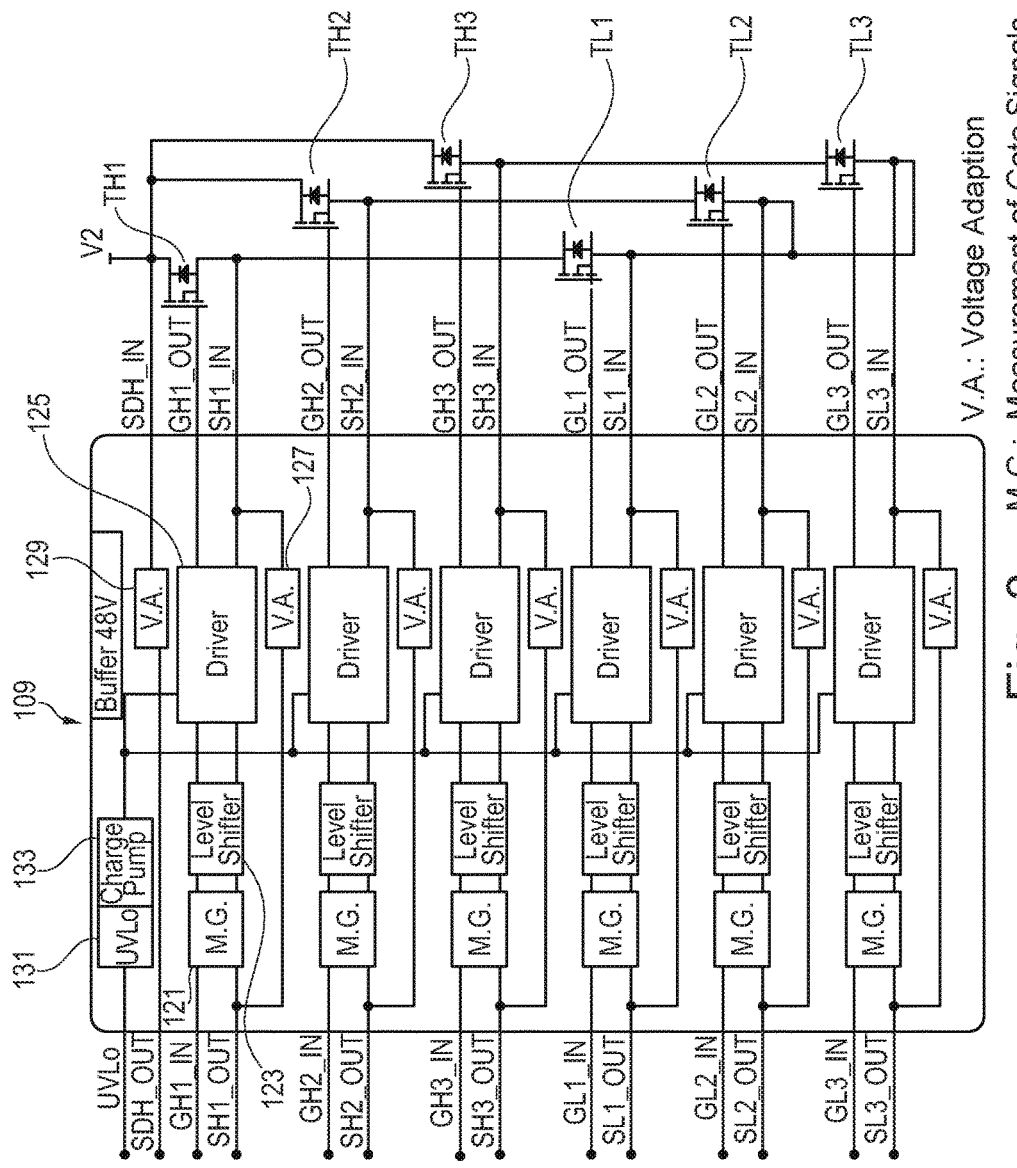
FIG. 3 is a block diagram of a gate interface logic unit (GILU) of the power system of FIG. 1, in an embodiment.

FIG. 3 is a block diagram of the GILU 109 of the power system 100 of FIG. 1, in an embodiment. To facilitate discussion, the HS power switches TH and the low side power switches TL, which are outside (thus do not belong to) the GILU 109, are also illustrated in FIG. 3. In the example of FIG. 3, all of the elements of the GILU 109 are integrated into an IC having input pins and output pins.

As illustrated in FIG. 3, the GILU 109 includes six gate interfaces 150 (see details in FIGS. 4-6) for driving the six power switches TH/TL, and the gate interfaces 150 have a same or similar structure. For example, a first gate interface 150, which includes a processing circuit 121, a level shifter 123, a driver circuit 125, a voltage adaptation circuit 127, and a voltage adaptation circuit 129, is formed between corresponding pins (e.g., GH1_IN, SH1_OUT, and SDH_OUT) configured to be coupled to the gate driver IC 107 and corresponding pins (e.g., GH1_OUT, SH1_IN, and SDH_IN) configured to be coupled to a first power switch TH1. More details of the gate interfaces 150 are discussed hereinafter with reference to FIGS. 4-6.

Still referring to FIG. 3, a first input terminal (e.g., the upper terminal of the processing circuit 121) of the processing circuit 121 is configured to accept as input a gate control voltage (e.g., an output voltage of a respective driver circuit 106 in FIG. 2) from the gate driver IC 107. A second input terminal (e.g., the lower terminal of the processing circuit 121) of the processing circuit 121 is coupled to an output terminal of the voltage adaptation circuit 127, which voltage adaptation circuit 127 is coupled to the source of the first power switch TH1 and provides, at the output terminal, a scaled value (e.g., a fraction of the original value) of the source voltage (e.g., a voltage at the source terminal) of the first power switch TH1. The scaled value of the source voltage may also be referred as a measurement or a measured value of the source voltage. The second input terminal of the processing circuit 121 is also coupled to an output pin of the GILU 109, which is coupled to a respective input pin of the gate driver IC 107.

Stilling referring to FIG. 3, the voltage adaptation circuit 129 is coupled to the drain of the first power switch TH1 and configured to output a scaled value of the drain voltage (e.g., a voltage at the drain terminal) of the first power switch TH1. The scaled value of the drain voltage may also be referred as a measurement or a measured value of the drain voltage. The output terminal of the voltage adaptation circuit 129 is coupled to an output pin of the GILU 109 that is coupled to a respective input pin of the gate driver IC 107. As illustrated in FIG. 3, an output of the driver circuit 125 is coupled to the gate of the first power switch TH1, and is configured to apply a gate driving voltage to the gate of the first power switch TH1.

In FIG. 3, five additional gate interfaces 150 (not labeled in FIG. 3) that are the same as or similar to the first gate interface 150 described above are formed between respective pins of the GILU 109 coupled to the gate driver IC 107 and respective pins of the GILU 109 coupled to the power switches TH/TL. In some embodiments, for the purpose of saving hardware, each of the five additional gate interfaces includes an instance of the voltage adaptation circuit 127 (coupled to the source of the respective power switch), but the voltage adaptation circuit 129 (coupled to the drain of the respective power switch) is not formed inside each of the five additional gate interfaces. This is because the drain voltages of all the HS power switches TH are the same (e.g., equal to the power supply voltage V2), thus the measured value from the voltage adaptation circuit 129 can be used as the measured drain voltage for all HS power switches TH. In addition, the drain voltage of each LS power switch TLx is the same as the source voltage of the corresponding HS power switch THx, thus the output of the voltage adaptation circuit 127 coupled to the source of the HS power switch THx may be used as the measured drain voltage for the LS power switch TLx, in some embodiments.

FIG. 3 further illustrates a charge pump 133 in the GILU 109. The charge pump 133 provides a voltage (e.g., 48 V) higher than a battery voltage supplied to the charge pump 133. For example, the charge pump 133 may generate a voltage 15 V above the supplied battery voltage to drive the driver circuit 125 and to drive the power switches TH/TL. In some embodiments, the charge pump 133 generates the power supply voltage V2 for the power switches TH/TL. In some embodiments, in order to guarantee a correct supply voltage for the power switches, a under-voltage detection block 131 is formed, which checks the output voltage of the charge pump 133 and sends a diagnostics signal to an output pin of the GILU 190 when the output voltage of the charge pump 133 is below a pre-determined threshold. The under-voltage detection block 131 may also check for other fault conditions of the charge pump 133. In the example of FIG. 3, the charge pump 133 and the under-voltage detection block 131 are shared (e.g., used) by all the gate interfaces 150.

In some embodiments, the diagnostic signal generated by the under-voltage detection block 131 is a digital signal with several different duty cycles, where each of the duty cycles is used to indicate a particular operating condition of the charge pump 133 detected by the under-voltage detection block 131. For example, a duty cycle of 10% may indicate that the charge pump 133 is working properly; a duty cycle of 20% may indicate an under voltage condition at the output of the charge pump 133; a duty cycle of 30% may indicate an over temperature condition at the charge pump 133; and a duty cycle of 40% may indicate an open circuit fault condition at the charge pump 133. In some embodiments, a communication interface with four pins is used between the under-voltage detection block 131 and the controller 102 of the gate driver IC 107. The above example of the diagnostic signal is illustrative and not limiting. Other methods for generating the diagnostic signal are possible and are fully intended to be included within the scope of the present disclosure.

Figure 4:
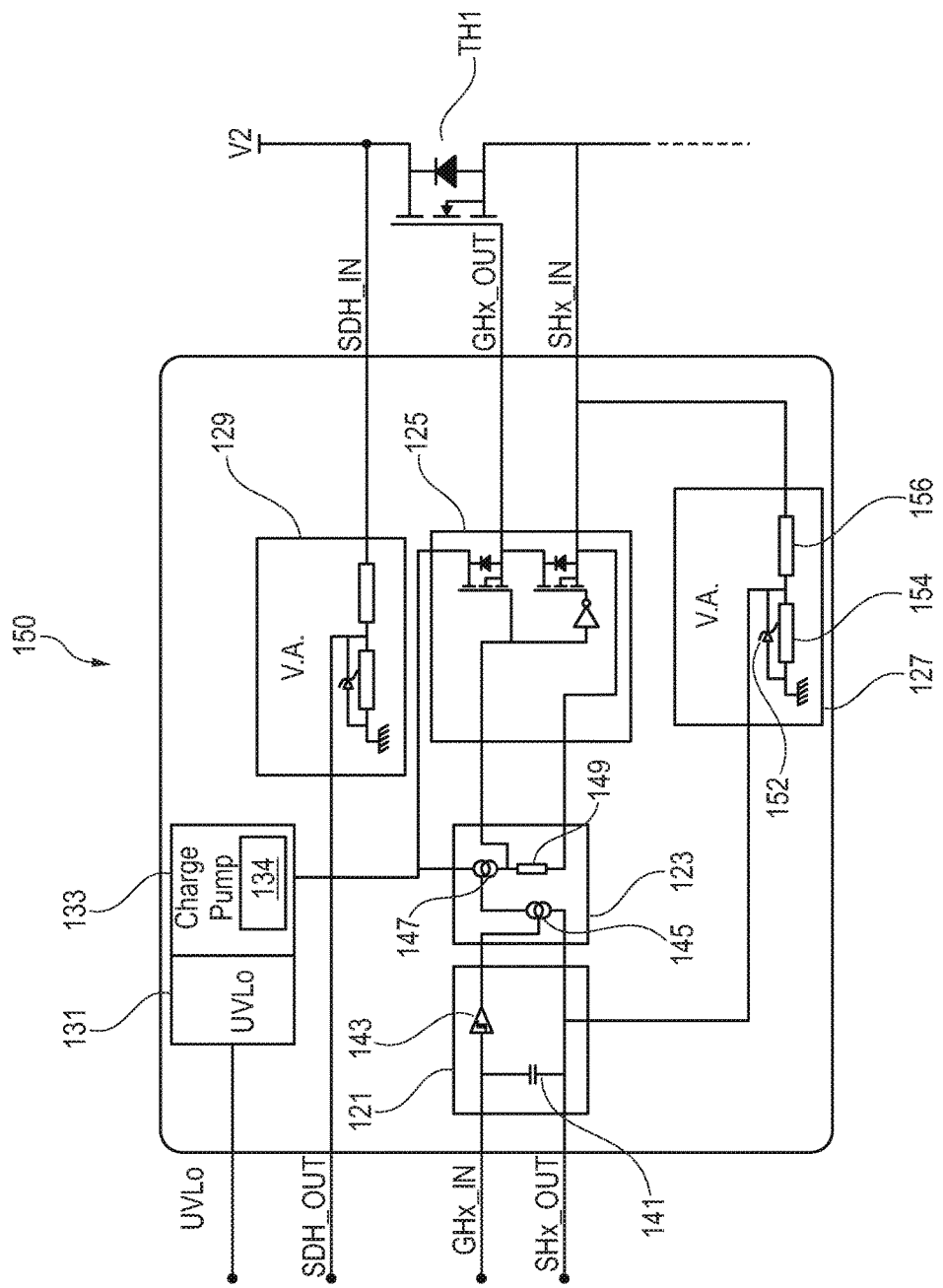
FIG. 4 illustrates a gate interface, in an embodiment.

FIG. 4 illustrates a block diagram of a gate interface 150, in an embodiment. The gate interface 150 of FIG. 4 may be used as the first gate interface 150 coupled to the first power switch TH1 (illustrated in FIG. 4 but not a part of the gate interface 150) in FIG. 3, and therefore, includes the voltage adaptation circuit 129 for measuring the drain voltage of the first power switch TH1. Note that the other gate interfaces 150 of the GILU 109, e.g., gate interfaces 150 coupled to power switches TH2, TH3, TL1, TL3 and TL3, are similar to the gate interface 150 of FIG. 4, but without the voltage adaptation circuit 129 for the purpose of saving hardware, as discussed previously. In addition, the gate interface 150 may optionally include the charge pump 133 and the under-voltage detection block 131, which may be suitable when each gate interface 150 is formed independently (e.g., each gate interface 150 formed in a separate IC as illustrated in FIG. 7). When more than one gate interfaces 150 are formed together, e.g., on a same IC, the charge pump 133 and the under-voltage detection block 131 may be formed only once and shared by all the gate interfaces 150. In other words, a single instance of the charge pump 133 and a single instance of the under-voltage detection block 131 are formed on the IC (e.g., outside the gate interfaces 150), and are shared by all of the gate interfaces 150 on the IC, in some embodiments. The gate interface 150 is formed using discrete components, in some embodiments. In other embodiments, the gate interface 150 is formed as an IC or a portion of an IC on a semiconductor substrate.

Referring to FIG. 4, the processing circuit 121 includes a comparator 143 configured to receive, at an input terminal of the comparator 143, a gate control voltage from the gate driver IC 107 via an input pin (e.g., GHx_IN) of the gate interface 150. The processing circuit 121 further includes a capacitor 141 coupled between the input terminal of the comparator 143 and an output terminal of the voltage adaptation circuit 127. The voltage adaptation circuit 127, which may include a voltage divider, outputs a measured value (e.g., a scaled value) of the source voltage of the power switch TH1. In some embodiments, the processing circuit 121 determines a state (e.g., ON or OFF) of the power switch TH1 by comparing the gate control voltage from the gate driver IC 107 and the measured value of the source voltage of the first power switch TH1. For example, the processing circuit 121 may compute a voltage difference between the gate control voltage from the gate driver IC 107 and the measured value of the source voltage of the first power switch TH1, and based on the computed voltage difference, determine whether to turn ON or OFF the power switch TH1.

FIG. 4 illustrates the level shifter 123, which includes current sources (e.g., voltage controlled current sources) 145 and 147, and a resistor 149. In some embodiments, the level shifter 123 shifts an output voltage of the processing circuit 121 to an output voltage (e.g., a voltage drop across the resistor 149) of the level shifter 123, which may be different from the output voltage of the processing circuit 121. For example, the output of the processing circuit 121 may be in a first power domain (e.g., voltages between 0~12 V, or 0~5 V), and the output of the level shifter 123 may be in a second power domain (e.g., voltages between 0~48 V). The level shifter 123 may be driven (e.g., powered) by the output of the charge pump 133, in the illustrated embodiment.

The output voltage of the level shifter 123 is sent to the driver circuit 125, which generates a driving voltage at an output terminal of the driver circuit 125. As illustrated in FIG. 4, the driver circuit 125 is powered by the output of the charge pump 133, and the driving voltage generated by the driver circuit 125 is applied to the gate of the power switch TH1 to control the switching of the power switch TH1. The processing circuit 121, the level shifter 123, and the driver circuit 125 of each gate interface 150 may be collectively referred to as a feedforward path between the gate driver IC 107 and the power switches TH/TL. In some embodiments, the charge pump 133, the level shifter 123, and/or the driver circuit 125 are designed to achieve a target driving voltage at the output of the driver circuit 125 that is suitable for (e.g., matches the requirement of) driving the power switches (e.g., TH/TL).

For different types of applications, different motors may be used that require different driving capabilities (e.g., driving voltages, and/or driving currents). In embodiments where the gate interface 150 is formed using discrete components, it is easy to adjust the design of the gate interface 150 to achieve different driving capabilities for the different types of motors, such that the same gate driver IC 107 may be used for different applications. In embodiments where the gate interface 150 is formed in an IC, the gate interface 150 may still provide certain degrees of flexibility to accommodate different applications. For example, as long as the driving voltages required is smaller than the break down voltage of the gate interface 150, the gate interface 150 may be used as the interface between the gate driver IC 107 and the power switches TH/TL to provide different driving voltages, e.g., by supplying appropriate input voltages to the charge pump 133 to generate the target driving voltages for the power switches. In some embodiments, the charge pump 133 is reconfigurable and has a control interface 134, which control interface 134 may be used to change the configuration of the charge pump 133 to, e.g., generate a different output voltage. The reconfigurable charge pump allows for additional flexibility to accommodate different driving capability requirements while using the same gate driver IC 107.

Still referring to FIG. 4, the voltage adaptation circuit 127 includes a voltage divider coupled between the source of the power switch TH1 and a reference voltage node (e.g., an electrical ground). The voltage adaptation circuit 127 provides a measured value (e.g., a scaled value) of the source voltage of the power switch TH1. In the illustrated embodiment, the voltage divider is formed by two resistors 154 and 156, and the voltage drop across the resistor 154 is sent out at the output terminal of the voltage adaptation circuit 127. In some embodiments, the output of the voltage adaptation circuit 127 is one third of the source voltage of the power switch TH1. A voltage limiting device 152, such as a Zener diode, is coupled in parallel with the resistor 154 to protect against over-voltage at the output terminal of the voltage adaptation circuit 127. The output terminal of the voltage adaptation circuit 127 is coupled to an output pin (e.g., SHx_OUT) of the gate interface 150, which output pin is coupled to a respective input pin of the gate driver IC 107. Since the power switches TH/TL may operate at a higher voltage (e.g., 48 V) than the gate driver IC 107, the voltage scaling provided by the voltage adaptation circuit 127 may prevent damage to the gate driver IC 107.

The voltage adaptation circuit 129 in FIG. 4 has a same structure as the voltage adaptation circuit 127, and is used to provide a measured value (e.g., a scaled value, such as ⅓) of the drain voltage of the power switch TH1. The output of the voltage adaptation circuit 129 is coupled to an output pin (e.g., SDH_OUT) of the gate interface 150, which output pin is coupled to a respective input pin of the gate driver IC 107. By computing the voltage difference between the outputs of the voltage adaptation circuits 129 and 127, the gate driver IC 107 may therefore monitor the drain source voltage of each of the power switches TH/TL, which drain source voltage indicates the state of the power switch, in some embodiments. The voltage adaptation circuit of 127 and the voltage adaptation circuit 129 (if formed) of each gate interface 150 may be collectively referred to as a feedback path between the gate driver IC 107 and the power switches TH/TL.

Figure 5:
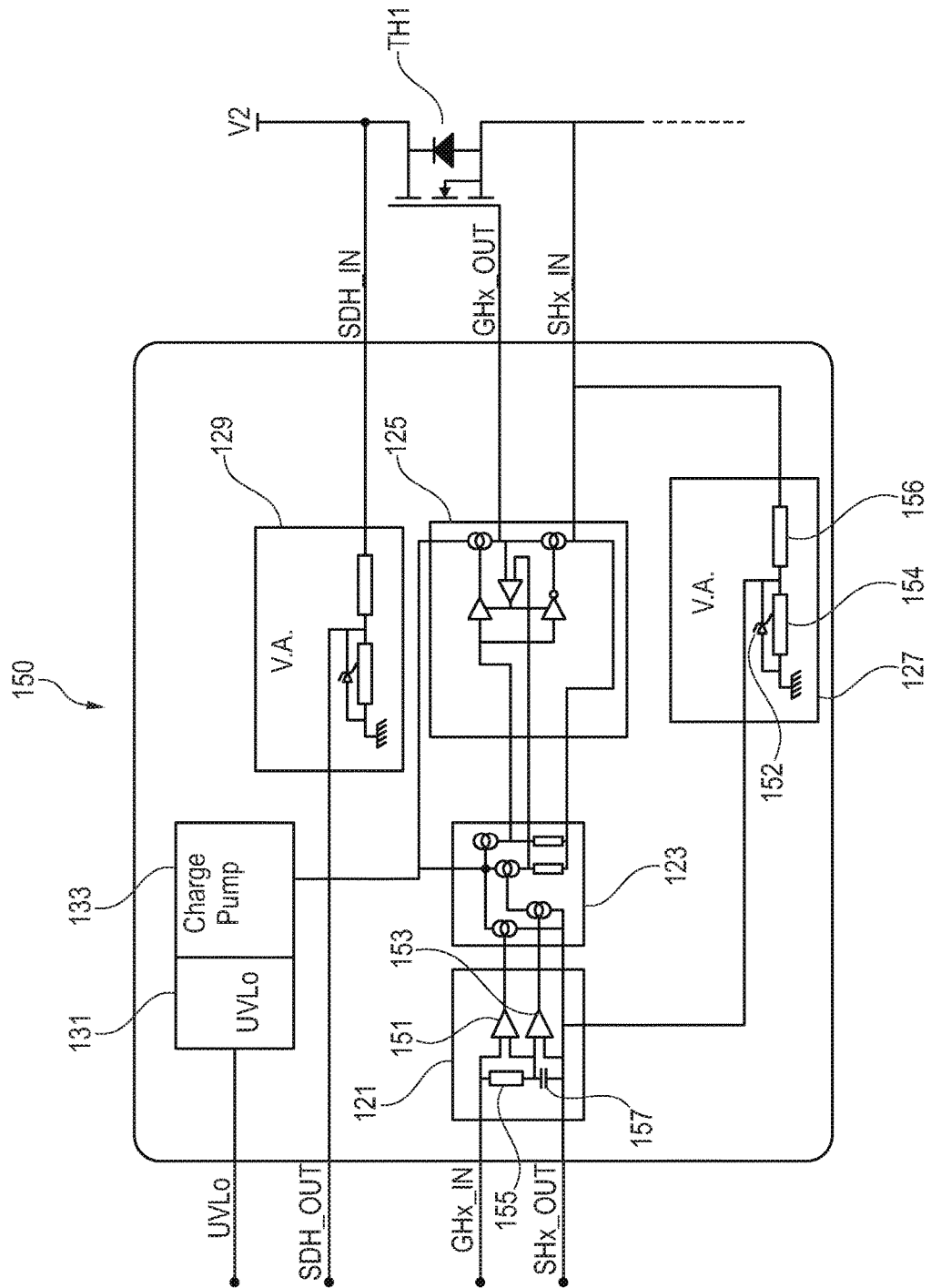
FIG. 5 illustrates a gate interface, in another embodiment.

FIG. 5 illustrates a block diagram of a gate interface 150, in another embodiment. The gate interface 150 is similar to the gate interface 150 of FIG. 4, but with different designs for the processing circuit 121, the level shifter 123 and the driver circuit 125. In FIG. 5, the processing circuit 121 has a first amplifier 151 and a second amplifier 153. The first amplifier 151 has a first input terminal (e.g., the upper terminal of the first amplifier 151 in FIG. 5) and a second input terminal (e.g., the lower terminal of the first amplifier 151 in FIG. 5), where the first input terminal of the first amplifier 151 is configured to accept as input a gate control voltage from the gate driver IC 107. As illustrated in FIG. 5, a resistor 155 is coupled between the first input terminal and the second input terminal of the first amplifier 151.

The second amplifier 153 has a first input terminal (e.g., the upper terminal of the second amplifier 153 in FIG. 5) and a second input terminal (e.g., the lower terminal of the second amplifier 153 in FIG. 5), where the second input terminal of the second amplifier 153 is coupled to the output terminal of the voltage adaptation circuit 127, and therefore, is configured to accept as input the scaled value of the source voltage of the first power switch TH1. The second input terminal of the second amplifier 153 is also coupled to an output pin (e.g., SHx_OUT) of the gate interface 150. As illustrated in FIG. 5, a capacitor 157 is coupled between the first input terminal and the second input terminal of the second amplifier 153. The capacitor 157 is connected to the resistor 155 at a node, which node is coupled to the second input terminal of the first amplifier 151 and the first input terminal of the second amplifier 153.

In some embodiments, the first amplifier 151 measures the driving current from the gate driver IC 107, and the second amplifier 153 measures the gate control voltage from the gate driver IC 107. Therefore, the processing circuit 121 is able to transmit the shape of the gate control voltage and the shape of the driving current to the power switches TH/TL via the level shifter 123 and via the driver circuit 125. In other words, the processing circuit 121 is able to measure and transmit to subsequent processing blocks the transient behavior (e.g., transient current) of the driving current and the transient behavior (e.g., transient voltage) of the gate control voltage when the gate control voltage turns ON or OFF the power switches.

Still referring to FIG. 5, the gate control voltage and the driving current measured by the processing circuit 121 are sent to the level shifter 123, which is a double level shifter. The level shifter 123 is similar that of FIG. 4, but with additional hardware to support the two measured values from the processing circuit 121. The level shifter 123 is powered by the charge pump 133, and shifts the outputs of the processing circuit 121 from a first voltage level to a second voltage level different (e.g., higher) from the first voltage level. In some embodiments, a multiplying coefficient (e.g., a scale factor larger than 1) is built into the level shifter 123 to amplify the driving current measured by the processing circuit 121, such that the gate interface 150 is able to provide improved driving capability to drive large power switches (e.g., large MOSFETs). The output of the level shifter 123 is then sent to the driver circuit 125 and mirrored at the output of the driver circuit 125. In the illustrated embodiment, the driver circuit 125 accepts the amplified driving current from the level shifter 123, and provides the gate current for the power switches. In some embodiments, to provide a scalable gate current, the driver circuit 125 includes a plurality of parallel-connected elementary current sources or current mirrors. One or more of the current sources or current mirrors are activated in accordance with the output of the level shifter 123 to provide the scalable gate current. As illustrated in FIG. 5, the output of the driver circuit 125 is applied to the gate of the power switch TH1. Similar to FIG. 4, the voltage adaptation circuits 127 and 129 provide measured values of the source voltage and the drain voltage of the power switch TH1, respectively, which may be used by the gate driver IC 107 to monitor the status of the power switch TH1. Advantages of the driver circuit 125 include, e.g., the ability to use a variable gate driver in the gate driver IC 107 to control the speed at which the gates of the power switches charge up, and ability to perform gate drive signal shaping where specific shapes for the gate control voltage and driving current are transferred to the power switches.

Figure 6:
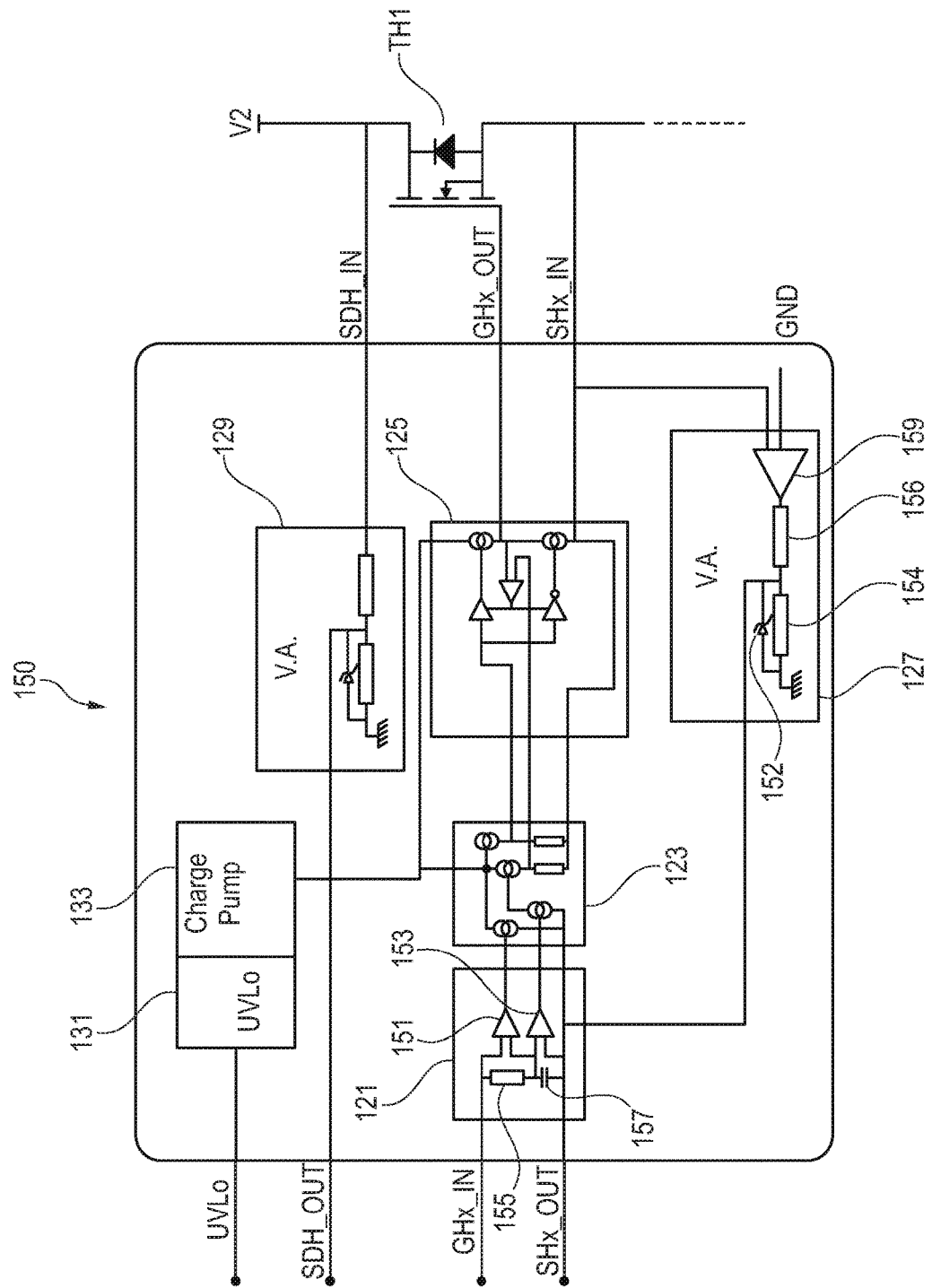
FIG. 6 illustrates a gate interface, in yet another embodiment.

FIG. 6 illustrates a block diagram of a gate interface 150, in yet another embodiment. The gate interface 150 of FIG. 6 is similar to that of FIG. 5, but with different design for the voltage adaptation circuit 127. In particular, the voltage adaptation circuit 127 of FIG. 6 has an amplifier 159 coupled between the resistor 156 and the power switch TH1. In some embodiments, when the power switches (e.g., TH1, TL1) are turned on, the source voltage of the power switch TH1 may be small (e.g., less than 1 V), which, when coupled with the scale factor (e.g., 1/3) of the voltage divider, results in an even smaller voltage at the output of the voltage adaptation circuit 127. Since a small voltage at the output of the voltage adaptation circuit 127 may result in low accuracy, e.g., when measured by the gate driver IC 107. The amplifier 159 increases the voltage at the output of the voltage adaptation circuit 127 to improve measurement accuracy, in some embodiments. The voltage limiting device 152 (e.g., a Zener diode) clamps the voltage at the output of the voltage adaptation circuit 127 to prevent over-voltage when the power switches are turned off, in some embodiments.

The various embodiment gate interfaces 150 support bi-directional communication between the gate driver IC 107 and the power switches TH/TL. Control signals (e.g., gate control voltages) from the gate driver IC 107 are relayed to the power switches via the gate interfaces 150, and feedback information (e.g., gate voltage and source voltage of the power switches) is sent back to the gate driver IC 107 via the gate interfaces 150. Since the gate interfaces 150 can shift voltages and improve driving capabilities, by using the gate interfaces between the gate driver IC 107 and the power switches, the same gate driver IC 107 may be used with different power switches having different driving capability requirements (e.g., driving voltages). This greatly reduces product development cost and time for designing power systems for various applications, and allows greater flexibility in choosing the components (e.g., gate driver IC 107, the power switches, the three-phase motor) of the power system. Another advantage of the gate interface 150 is that it provides a safe isolation between the gate driver IC 107 and the power switches TH/TL. For example, if one of the power switches TH/TL breaks down (e.g., short circuit) during operation, the gate driver IC 107 will not be damaged due to the isolation provided by the gate interface 150, although the gate interface 150 coupled to the damaged power switch may be damaged. In addition, due to the use of the gate interface 150, the gate driver IC 107 may be located on a different circuit board (e.g., a printed-circuit board (PCB)) than the power switches TH/TL. This allows for different packages and/or different technologies to be used for the different PCB boards, thus increasing the flexibility in the design options and allows for partitioning optimization.

In the embodiment illustrated in FIG. 1, the GILU 109 is an IC that integrates all of the gate interfaces 150 on one monolithic semiconductor substrate. This is merely an example and not limiting. Other partitions or implementations are possible and are fully intended to be included within the scope of the present disclosure. FIGS. 7-9 illustrates additional embodiments.

In FIG. 7, each of the gate interfaces 150 is integrated into a separate IC (formed on a separate monolithic semiconductor substrate), and each of the ICs (comprising a gate interface iso) is used as a bi-directional interface between the gate driver IC 107 and a respective power switch. By the forming the gate interfaces 150 into separate ICs, robustness of the power system is increased. For example, if a power switch breaks down, only the IC that includes the gate interface 150 coupled to the damaged power switch is prone to damage while remaining gate interfaces 150 in other ICs continue to function. The gate driver IC 107 may therefore be able to detect the damaged power switch (e.g., by monitoring the measured drain-source voltage of the power switch and comparing it with an expected value), report an error status, and may control the un-damaged power switches through the un-damaged gate interfaces to operate in a limp-home mode until, e.g., it is safe to stop the motor.

In FIG. 8, three gate interfaces 150, each integrated into a separate IC, are used to drive the high side power switches TH, and the low side power switches TL are driven by the driver circuit 106 (see FIG. 2) of the gate driver IC 107 via the data path 104. The data path 104 is a bi-directional path that carries, e.g., control signals from the gate driver IC 107 to the low side power switches TL, and carries status information from the low side power switches TL to the gate driver IC 107.

In FIG. 9, three gate interfaces 150 are integrated into a same IC to form the GILU 109, and the GILU 109 is used to drive the high side power switches TH. The low side power switches TL are driven by the driver circuit 106 (see FIG. 2) of the gate driver IC 107 via the data path 104.

Variations and modifications to the disclosed embodiments are possible and are fully intended to be included within the scope of the present disclosure. For example, the number of gate interfaces 150 used in the power system, the locations of the gate interfaces 150 (e.g., which power switch to couple to), and the partitioning of the gate interfaces 150 into one or more ICs may be changed without departing from the spirit of the present disclosure. As another example, besides measuring the drain-source voltage of the power switches, the drain-source current of the power switches may also be measured by the gate interfaces 150 and sent as an output of the gate interface 150 to the gate driver IC 107. This may be achieved, e.g., by coupling a shunt resistor between the drain of the power switch TH1 and a power supply node (e.g., the node with the label V2 in FIG. 4), and coupling two voltage adaptation circuits to two ends of the shunt resistor, where each of two voltage adaptation circuits is the same as or similar to the voltage adaptation circuit 127 in FIG. 4. The difference between the outputs of the two voltage adaptation circuit is proportional to the drain-source current of the power switch, and may be sent back to the gate driver IC 107.

Embodiments may achieve advantages. For example, the gate interface 150 allows the same gate driver IC 107 to be used for various applications with different driving capability requirements, thus greatly reducing the product development time and cost. The gate interface 150 provides isolation between the power switches and the gate driver IC 107, and prevents the gate driver IC 107 from being damaged when one or more of the power switches break down during operation. The processing circuit of the gate interface 150 may be designed to support transmitting the shape of the gate control voltage and the shape of the driving current to the power switches for gate shaping. The gate interfaces 150 also allows the gate driver IC 107 to be located on a different PCB than the power switches, thereby increasing the flexibility in the design options and allows for partitioning optimization.

Figure 10:
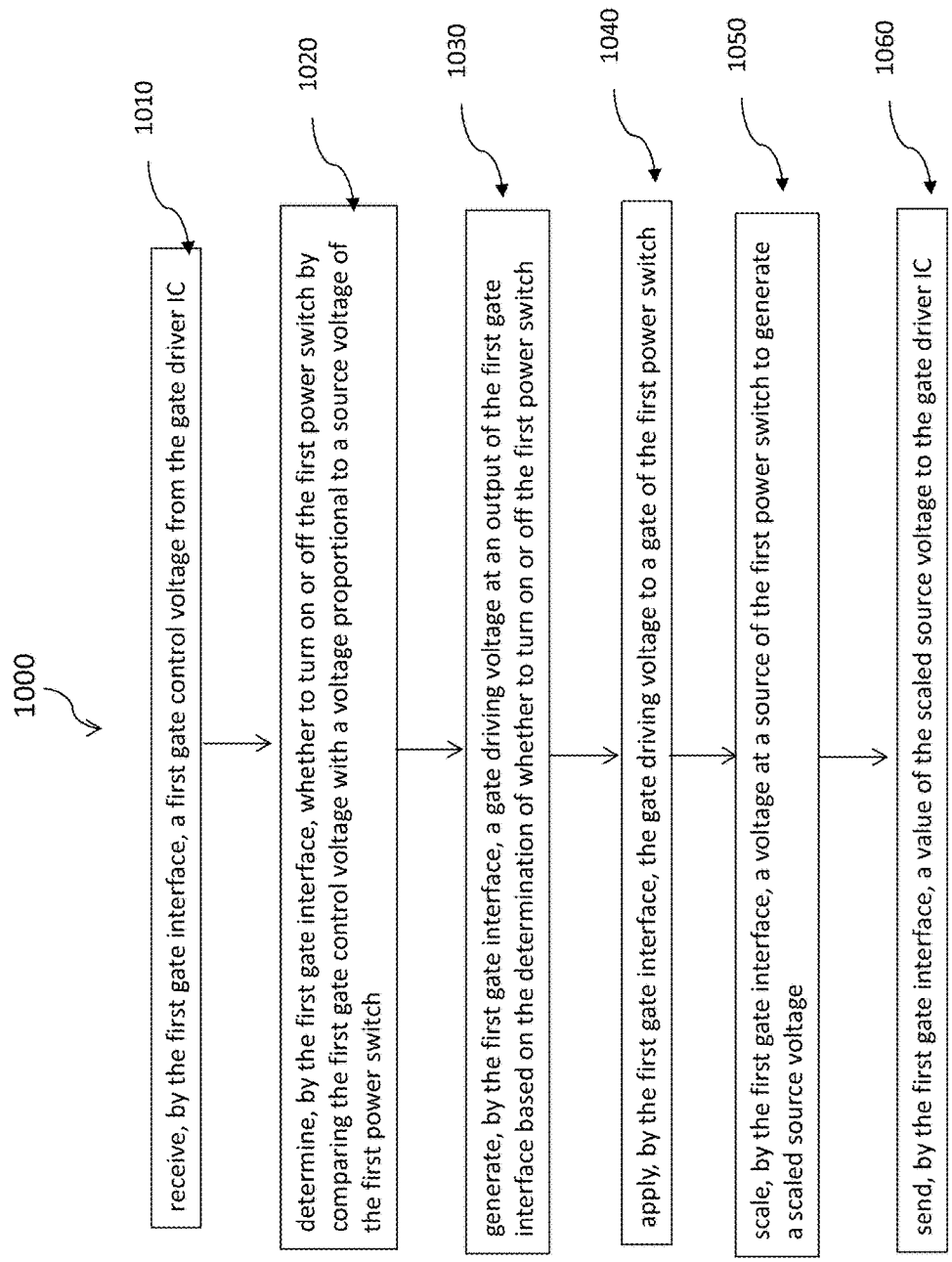
FIG. 10 is a flow chart for a method of operating a power system, in some embodiments.

FIG. 10 illustrates a flow chart of a method 1000 of operating a power system, where the power system includes a first gate interface configured to be coupled between a gate driver IC and a first power switch, in accordance with some embodiments. It should be understood that the embodiment method shown in FIG. 10 is merely an example of many possible embodiment methods. One of ordinary skill in the art would recognize many variations, alternatives, and modifications. For example, various steps as illustrated in FIG. 10 may be added, removed, replaced, rearranged and repeated.

Referring to FIG. 10, at step 1010, a first gate control voltage from the gate driver IC is received by the first gate interface of the power system. At step 1020, the first gate interface determines whether to turn on or off the first power switch by comparing the first gate control voltage with a voltage proportional to a source voltage of the first power switch. At step 1030, the first gate interface generates a gate driving voltage at an output of the first gate interface based on the determination of whether to turn on or off the first power switch. At step 1040, the first gate interface applies the gate driving voltage to a gate of the first power switch. At step 1050, the first gate interface scales a voltage at a source of the first power switch to generate a scaled source voltage. At step 1060, the first gate interface sends a value of the scaled source voltage to the gate driver IC.

Example embodiments of the present invention are summarized here. Other embodiments can also be understood from the entirety of the specification and the claims filed herein.

Example 1

In an embodiment, a circuit includes a first feedforward path configured to determine a state of a first power switch using a first gate control voltage from a gate driver and a source voltage of the first power switch, and to apply a gate driving voltage to a gate of the first power switch based on the determined state of the first power switch; and a first feedback path configured to provide a scaled value of a drain voltage of the first power switch and a scaled value of the source voltage of the first power switch to the gate driver, where the first feedforward path and the first feedback path are configured to provide a bi-directional gate interface coupled between the gate driver and the first power switch.

Example 2

The circuit of example 1, where the first feedforward path includes a processing circuit, a driver circuit, and a level shifter coupled between the processing circuit and the driver circuit, where the processing circuit is configured to determine the state of the first power switch using the first gate control voltage and the source voltage of the first power switch; the level shifter is configured to shift a first output voltage of the processing circuit to a second output voltage; and the driver circuit is configured to generate the gate driving voltage based on the second output voltage, and to apply the gate driving voltage to the gate of the first power switch.

Example 3

The circuit of example 2, where the processing circuit is configured to measure a driving current from the gate driver, and where the level shifter is configured to amplify the measured driving current.

Example 4

The circuit of example 2, further including a charge pump coupled to the processing circuit and the level shifter, the charge pump configured to provide a supply voltage to the processing circuit and the level shifter.

Example 5

The circuit of example 4, further including an undervoltage detection block configured to: compare the driving voltage provided by the charge pump with a pre-determined threshold, and in response to detecting that the driving voltage provided by the charge pump is below the predetermined threshold, generate a diagnostic signal at an output terminal.

Example 6

The circuit of example 4, where the charge pump is reconfigurable, and an output voltage of the charge pump is configured in accordance with an operational voltage of the first power switch.

Example 7

The circuit of example 2, where the first feedback path includes: a first voltage adaptation circuit coupled to a drain of the first power switch and configured to provide the scaled value of the drain voltage of the first power switch at a first output terminal; and a second voltage adaptation circuit coupled to a source of the first power switch and configured to provide the scaled value of the source voltage of the first power switch at a second output terminal.

Example 8

The circuit of example 7, where the processing circuit includes a comparator having a first terminal configured to receive the first gate control voltage from the gate driver; and a capacitor coupled between the first terminal of the comparator and an output of the second voltage adaptation circuit.

Example 9

The circuit of example 7, where the processing circuit includes a first amplifier having a first input terminal and a second input terminal, the first input terminal of the first amplifier being configured to accept as input the first gate control voltage from the gate driver; a resistor coupled between the first input terminal of the first amplifier and the second input terminal of the first amplifier; a second amplifier having a first input terminal and a second input terminal, the second input terminal of the second amplifier being configured to accept as input the scaled value of the source voltage of the first power switch, the second input terminal of the second amplifier being coupled to the second output terminal; and a capacitor coupled between the first input terminal of the second amplifier and the second input terminal of the second amplifier, the capacitor connected to the resistor at a first node, the second input terminal of the first amplifier and the first input terminal of the second amplifier being connected to the first node.

Example 10

The circuit of example 9, where the processing circuit is configured to transmit to the level shifter a transient behavior of the first gate control voltage and a transient behavior of a first gate control current corresponding to the first gate control voltage.

Example 11

The circuit of example 7, where the first voltage adaptation circuit comprises a first voltage divider coupled between the drain of the first power switch and a reference voltage node, and the second voltage adaptation circuit comprises a second voltage divider coupled between the source of the first power switch and the reference voltage node, where each of the first voltage divider and the second voltage divider comprises: a first resistor; a second resistor coupled between the first resistor and the reference voltage node, where a node between the first resistor and the second resistor is coupled to the processing circuit; and a voltage limiting device coupled in parallel with the second resistor.

Example 12

The circuit of example 11, where the voltage limiting device is a Zener diode.

Example 13

The circuit of example 11, where the second voltage adaptation circuit further comprises an amplifier coupled between the second voltage divider and the first power switch, where a first input terminal of the amplifier is coupled to the drain of the first power switch, a second input terminal of the amplifier is coupled to the source of the first power switch, and an output terminal of the amplifier is coupled to the second voltage divider.

Example 14

The circuit of example 1 further includes the first power switch coupled to the first feedforward path and the first feedback path; and the gate driver coupled to the first feedforward path and the first feedback path.

Example 15

A power system includes a gate driver integrated circuit (IC); a plurality of power switches; and a first gate interface between the gate driver IC and a first power switch of the plurality of power switches, where the first gate interface is configured to: determine, using a first processing circuit, whether to turn the first power switch on or off by comparing a first gate control voltage provided at a first output pin of the gate driver IC and a first voltage at a first input pin of the gate driver IC that is proportional to a voltage at a source of the first power switch; shift, using a first level shifter, an output voltage of the first processing circuit to an output voltage of the first level shifter different from the output voltage of the first processing circuit; supply, using a first driver circuit, a driving voltage at a gate of the first power switch; and send, using first voltage adaptation circuits, a value of a source voltage and a value of a drain voltage of the first power switch to the gate driver IC.

Example 16

The power system of example 15, where the first processing circuit is configured to transmit a shape of the first gate control voltage to the first level shifter, where the shape of the first gate control voltage comprises a transient voltage when the first gate control voltage turns on or off the first power switch.

Example 17

The power system of example 15, further comprising a second gate interface between the gate driver IC and a second power switch of the plurality of power switches, where the second gate interface is configured to: determine, using a second processing circuit, whether to turn the second power switch on or off by comparing a second gate control voltage provided at a second output pin of the gate driver IC and a second voltage at a second input pin of the gate driver IC that is proportional to a voltage at a source of the second power switch; shift, using a second level shifter, an output voltage of the second processing circuit to an output voltage of the second level shifter different from the output voltage of the second processing circuit; supply, using a second driver circuit, a driving voltage at a gate of the second power switch; and send, using second voltage adaptation circuits, a value of a source voltage and a value of a drain voltage of the second power switch to the gate driver IC.

Example 18

The power system of example 17, where the first gate interface is implemented on a first monolithic semiconductor substrate, and the second gate interface is implemented on a second monolithic semiconductor substrate physically separated from the first monolithic semiconductor substrate.

Example 19

The power system of example 17, where the first gate interface and the second gate interface are implemented on a same monolithic semiconductor substrate.

Example 20

A method of operating a power system, which includes a first gate interface configured to be coupled between a gate driver integrated circuit (IC) and a first power switch, includes: receiving, by the first gate interface, a first gate control voltage from the gate driver IC; determining, by the first gate interface, whether to turn on or off the first power switch by comparing the first gate control voltage with a voltage proportional to a source voltage of the first power switch; generating, by the first gate interface, a gate driving voltage at an output of the first gate interface based on the determination of whether to turn on or off the first power switch; applying, by the first gate interface, the gate driving voltage to a gate of the first power switch; scaling, by the first gate interface, a voltage at a source of the first power switch to generate a scaled source voltage; and sending, by the first gate interface, a value of the scaled source voltage to the gate driver IC.

Example 21

The method of example 20, further comprising: sending, by the first gate interface, a value of a drain voltage of the first power switch to the gate driver IC.

Example 22

The method of example 20, further comprising: sending, by the first gate interface, a value of a voltage drop across a shunt resistor to the gate driver IC, where the shunt resistor is coupled between a drain of the first power switch and a power supply node coupled to the drain of the first power switch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
 a first feedforward path configured to determine a state of a first power switch using a first gate control voltage from a gate driver and a source voltage of the first power switch, and to apply a gate driving voltage to a gate of the first power switch based on the determined state of the first power switch; and
 a first feedback path configured to provide a scaled value of a drain voltage of the first power switch and a scaled value of the source voltage of the first power switch to the gate driver,
 wherein the first feedforward path and the first feedback path are configured to provide a bi-directional gate interface coupled between the gate driver and the first power switch.

2. The circuit of claim 1, wherein the first feedforward path comprises a processing circuit, a driver circuit, and a level shifter coupled between the processing circuit and the driver circuit, wherein
 the processing circuit is configured to determine the state of the first power switch using the first gate control voltage and the source voltage of the first power switch;
 the level shifter is configured to shift a first output voltage of the processing circuit to a second output voltage; and
 the driver circuit is configured to generate the gate driving voltage based on the second output voltage, and to apply the gate driving voltage to the gate of the first power switch.

3. The circuit of claim 2, wherein the processing circuit is configured to measure a driving current from the gate driver, and wherein the level shifter is configured to amplify the measured driving current.

4. The circuit of claim 2, further comprising a charge pump coupled to the processing circuit and the level shifter, the charge pump configured to provide a supply voltage to the processing circuit and the level shifter.

5. The circuit of claim 4, further comprising an under-voltage detection block configured to:
compare the driving voltage provided by the charge pump with a pre-determined threshold, and
in response to detecting that the driving voltage provided by the charge pump is below the pre-determined threshold, generate a diagnostic signal at an output terminal.

6. The circuit of claim 4, wherein the charge pump is reconfigurable, and an output voltage of the charge pump is configured in accordance with an operational voltage of the first power switch.

7. The circuit of claim 2, wherein the first feedback path comprises:
a first voltage adaptation circuit coupled to a drain of the first power switch and configured to provide the scaled value of the drain voltage of the first power switch at a first output terminal; and
a second voltage adaptation circuit coupled to a source of the first power switch and configured to provide the scaled value of the source voltage of the first power switch at a second output terminal.

8. The circuit of claim 7, wherein the processing circuit comprises:
a comparator having a first terminal configured to receive the first gate control voltage from the gate driver; and
a capacitor coupled between the first terminal of the comparator and an output of the second voltage adaptation circuit.

9. The circuit of claim 7, wherein the processing circuit comprises:
a first amplifier having a first input terminal and a second input terminal, the first input terminal of the first amplifier being configured to accept as input the first gate control voltage from the gate driver;
a resistor coupled between the first input terminal of the first amplifier and the second input terminal of the first amplifier;
a second amplifier having a first input terminal and a second input terminal, the second input terminal of the second amplifier being configured to accept as input the scaled value of the source voltage of the first power switch, the second input terminal of the second amplifier being coupled to the second output terminal; and
a capacitor coupled between the first input terminal of the second amplifier and the second input terminal of the second amplifier, the capacitor connected to the resistor at a first node, the second input terminal of the first amplifier and the first input terminal of the second amplifier being connected to the first node.

10. The circuit of claim 9, wherein the processing circuit is configured to transmit to the level shifter a transient behavior of the first gate control voltage and a transient behavior of a first gate control current corresponding to the first gate control voltage.

11. The circuit of claim 7, wherein the first voltage adaptation circuit comprises a first voltage divider coupled between the drain of the first power switch and a reference voltage node, and the second voltage adaptation circuit comprises a second voltage divider coupled between the source of the first power switch and the reference voltage node, wherein each of the first voltage divider and the second voltage divider comprises:
a first resistor;
a second resistor coupled between the first resistor and the reference voltage node, wherein a node between the first resistor and the second resistor is coupled to the processing circuit; and
a voltage limiting device coupled in parallel with the second resistor.

12. The circuit of claim 11, wherein the voltage limiting device is a Zener diode.

13. The circuit of claim 1, further comprising:
the first power switch coupled to the first feedforward path and the first feedback path; and
the gate driver coupled to the first feedforward path and the first feedback path.

14. A power system comprising:
a gate driver integrated circuit (IC);
a plurality of power switches; and
a first gate interface between the gate driver IC and a first power switch of the plurality of power switches, wherein the first gate interface is configured to:
determine, using a first processing circuit, whether to turn the first power switch on or off by comparing a first gate control voltage provided at a first output pin of the gate driver IC and a first voltage at a first input pin of the gate driver IC that is proportional to a voltage at a source of the first power switch;
shift, using a first level shifter, an output voltage of the first processing circuit to an output voltage of the first level shifter different from the output voltage of the first processing circuit;
supply, using a first driver circuit, a driving voltage at a gate of the first power switch; and
send, using first voltage adaptation circuits, a value of a source voltage and a value of a drain voltage of the first power switch to the gate driver IC.

15. The power system of claim 14, wherein the first processing circuit is configured to transmit a shape of the first gate control voltage to the first level shifter, wherein the shape of the first gate control voltage comprises a transient voltage when the first gate control voltage turns on or off the first power switch.

16. The power system of claim 14, further comprising a second gate interface between the gate driver IC and a second power switch of the plurality of power switches, wherein the second gate interface is configured to:
determine, using a second processing circuit, whether to turn the second power switch on or off by comparing a second gate control voltage provided at a second output pin of the gate driver IC and a second voltage at a second input pin of the gate driver IC that is proportional to a voltage at a source of the second power switch;
shift, using a second level shifter, an output voltage of the second processing circuit to an output voltage of the second level shifter different from the output voltage of the second processing circuit;
supply, using a second driver circuit, a driving voltage at a gate of the second power switch; and
send, using second voltage adaptation circuits, a value of a source voltage and a value of a drain voltage of the second power switch to the gate driver IC.

17. The power system of claim 16, wherein the first gate interface is implemented on a first monolithic semiconductor substrate, and the second gate interface is implemented on a second monolithic semiconductor substrate physically separated from the first monolithic semiconductor substrate.

18. The power system of claim 16, wherein the first gate interface and the second gate interface are implemented on a same monolithic semiconductor substrate.

19. A method of operating a power system, the power system comprising a first gate interface configured to be coupled between a gate driver integrated circuit (IC) and a first power switch, the method comprising:

receiving, by the first gate interface, a first gate control voltage from the gate driver IC;

determining, by the first gate interface, whether to turn on or off the first power switch by comparing the first gate control voltage with a voltage proportional to a source voltage of the first power switch;

generating, by the first gate interface, a gate driving voltage at an output of the first gate interface based on the determination of whether to turn on or off the first power switch;

applying, by the first gate interface, the gate driving voltage to a gate of the first power switch;

scaling, by the first gate interface, a voltage at a source of the first power switch to generate a scaled source voltage; and sending, by the first gate interface, a value of the scaled source voltage to the gate driver IC.

20. The method of claim 19, further comprising:

sending, by the first gate interface, a value of a drain voltage of the first power switch to the gate driver IC.

21. The method of claim 19, further comprising:

sending, by the first gate interface, a value of a voltage drop across a shunt resistor to the gate driver IC, wherein the shunt resistor is coupled between a drain of the first power switch and a power supply node coupled to the drain of the first power switch.

* * * * *